United States Patent [19]

Adams et al.

[11] Patent Number: 5,026,748
[45] Date of Patent: Jun. 25, 1991

[54] THERMALLY CONDUCTIVE ADHESIVE

[75] Inventors: Jerome T. Adams, Hockessin; Bruce A. Yost, Newark, both of Del.

[73] Assignee: E. I. du Pont de Nemours and Company, Wilmington, Del.

[21] Appl. No.: 520,286

[22] Filed: May 7, 1990

[51] Int. Cl.$^5$ .......................... C08J 00/00; C08L 00/00
[52] U.S. Cl. ...................................... 524/66; 524/495; 524/496
[58] Field of Search .......................... 524/66, 495, 496

[56] References Cited

U.S. PATENT DOCUMENTS

| 4,522,771 | 6/1985 | McLaughlin | 264/61 |
| 4,609,586 | 9/1986 | Jensen et al. | 428/209 |
| 4,689,110 | 8/1987 | Leibowitz | 156/634 |
| 4,791,076 | 12/1988 | Leggett et al. | 501/95 |
| 4,861,653 | 8/1989 | Parrish | 428/288 |

Primary Examiner—Paul R. Michl
Assistant Examiner—U. K. Rajguru

[57] ABSTRACT

Adhesive resins are filled with carbon fibers that have a three-dimensional structure. The fibers have variable lengths and widths. The fiber filled adhesive exhibits high thermal conductivity values. Electronic systems having components bonded by a layer of these adhesives resins have high through-the-thickness thermal conductivity.

10 Claims, 2 Drawing Sheets

F I G. 1
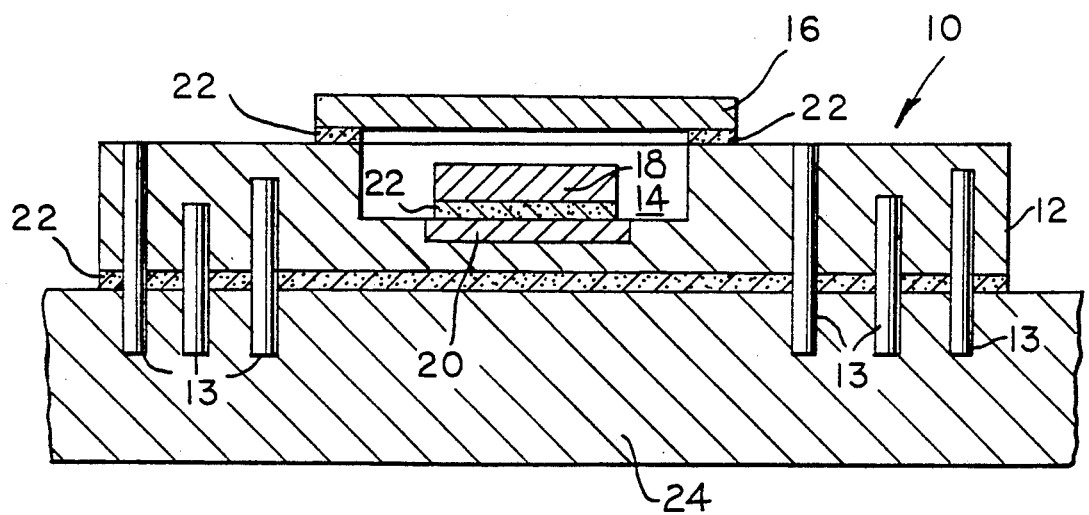

THERMALLY CONDUCTIVE ADHESIVE

CROSS REFERENCE TO RELATED APPLICATION

The following application of common assignee contains some common disclosure with that of the present application:
Title: Improved Thermal Conductive Material
Ser. No.: 07/251,1783
Filed: Oct. 3, 1988

BACKGROUND OF THE INVENTION

This invention relates to thermally conductive adhesives and, more particularly, it relates to an adhesive matrix filled with a three-dimensional arrangement of mesophase pitch based carbon fibers.

Thermal management in electronic packaging has always been an important design consideration, and it is even more so today because packaging density (and hence heat dissipation) is increasing dramatically. More powerful and closer spaced chips, finer grid patterns, and surface mount devices such as leadless ceramic chip carriers need materials exhibiting high thermal conductivities and/or tailorable coefficients of thermal) expansions (CTE), so that heat removal is efficient and/or CTE mismatches between components are reduced. Facilitating heat removal and reducing CTE mismatches are very desirable attributes for they lead to more flexible packaging design, improved operating performance, and increased life expectancy (through reduced failures).

Thermally conductive, tailorable CTE organic-based adhesives (in paste or film form) play an important role in thermal management in electronic packaging. They are used for a variety of applications, including:
die (chip) bonding to chip carriers, substrates or heat sinks
chip carrier and substrate attachment to printed wiring boards (PWB)
PWB bonding to heat sinks
heat sink attachment to chassis
lid sealing
resistor, capacitor, diode, etc. attachment (i.e. using fillet adhesives)

Typically these adhesives are filled with metallic fillers such as silver or inorganic fillers such as alumina or boron nitride. Alumina fillers, which are electrically insulating, increase the thermal conductivity of the base polymer approximately 3-5×, based on the filler loading, geometry and size. Silver flakes are used when maximum thermal conductivity and electrical conductivity are required, as it too increases the thermal conductivity of the base polymer approximately 3-5×, depending on the loading. All of these fillers have several drawbacks, however. High weight percentages of silver are required (e.g. 79 wt. % is used in some adhesives to achieve the desired performance levels), and since silver is expensive, the cost of these fillers becomes substantial. Similar to silver, high weight percentages of inorganic fillers are also required and are relatively expensive as well. Silver also suffers from a phenomena referred to as metallic electromigration; an article by S. Krumbein (IEEE Transactions on Components, Hybrids, and Manufacturing Technology, Vol. 11, No. 1, Mar. 1988) describes metal migration in more detail.

It is known to use adhesives filled with carbon fibers for the purpose of making electrical connections in electrical systems bound together by the adhesive.

SUMMARY OF THE INVENTION

An adhesive material has been developed to complement the move toward thermal management in electronic packaging which exhibits a cost effective combination of needed properties including high thermal conductivities, uniform in-plane CTE's, low density and high stiffness. This material comprises an adhesive filled with from about 20 to about 60 weight percent of three-dimensional structure of mesophase pitch based carbon fibers. The carbon fibers are of variable length and variable width. Preferably the fibers have a length to width ratio greater than 10 and the fibers have a distribution of width of from about 1 to about 10 micrometers. These fibers are described in U.S. Pat. No. 4,861,653 which is incorporated herein by reference.

Suitable adhesive resins are synthetic adhesives such as thermosetting, thermoplastic, elastomeric or combinations of these types.

According to the "Adhesives Technology Handbook" (Noyes Publications, 1985), there are four basic types of adhesives: liquids, pastes, tapes and films, and powders or granules. The two most common type of adhesives for structural and electronic applications are pastes and films. To make a three dimensional structure of mesophase pitch based carbon fiber filled paste, the fibers are added as uniformly as possible to the paste and the components are mixed to get a homogeneous blend. The rheology of the filled paste would be closely controlled by varying the chemistry of the paste and the amount of fiber that is added. (Pastes typically have high viscosities).

To make a three dimensional structure of mesophase pitch based carbon fiber filled adhesive film, at least two routes are available. First, if the adhesive resin was in liquid form, the fibers would be added as uniformly as possible and the components would be mixed to give a homogeneous blend. This methodology would help ensure fiber encapsulation and promote film uniformity and homogeneity. As for the pastes, the rheology would be closely controlled by varying the chemistry of the resin and the amount of fiber that is added. To form the adhesive film, the homogeneous blend would be cast using film-casting equipment.

An alternate route would be if the resin is in powder or granule form, such as a thermoplastic resin might be. A three dimensional structure of mesophase pitch based carbon fiber would be added as uniformly as possible and dry blended to give a homogeneous mixture. The homogeneous blend would be cast to form an adhesive film using an extruder and film casting equipment, or what is commonly done is to extrude pellets of the blend and then use the pellets to extrude adhesive film.

BRIEF DESCRIPTION OF THE DRAWING

FIG. 1 is a schematic cross sectioned elevation view of a general electronic packaging arrangement in which the thermally conductive adhesives of this invention are useful.

FIG. 2a is a vector diagram representative of three dimensional fiber placement in the adhesive layer of FIG. 2.

DETAILED DESCRIPTION OF THE INVENTION

Figure 2:
FIG. 2 is a photomicrograph of an adhesive layer of this invention.
Figure 2:
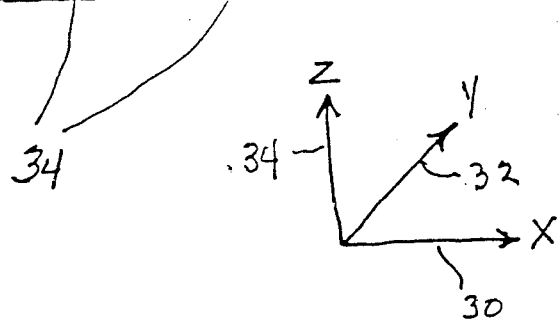

Referring now to FIG. 1, the structure 10 shown is referred to broadly as an electronic packaging system that includes as component parts a base 12 carrying a plurality of pins 13 and having a cavity 14 covered by a lid 16. Within cavity 14 is a die or a chip 18 that is adhered to a heat sink 20 by means of thermal adhesive layer 22. A similar thermal adhesive layer 22 seals lid 16 to the base 12 and the base 12 to a printed wiring board 24.

In FIG. 2 the adhesive layer of Example 3 (28 volume percent fibers) is displayed photomicrographically (200×). A structure showing a resin filled with a three-dimensional fiber structure with fibers of varying lengths and widths is observed. More particularly, fibers 30 are oriented in-plane in the x direction, fibers 32 are oriented in-plane in the y direction; and fibers 34 are oriented out-of-plane or through-the-thickness in the z direction.

These broad utility, general purpose adhesives are particularly attractive to the electronic packaging community, where thermal management is always an issue while weight and stiffness can be (such as in avionic systems). They do not suffer from metal migration and they require less weight of filler than incumbent technologies (e.g. silver flakes or alumina fillers) to achieve a desired level of performance. These adhesives can also be used for structural applications (e.g. bonding a composite part to another composite part or bonding a composite part to a piece of metal such as an end fitting), where CTE mismatches must be minimized. In these applications, the filaments' propensity to form ~3-D reinforced composites may also be advantageous in increasing the interlaminar shear strength of bonded composites through through-the-thickness (out-of-plane) reinforcement.

THERMAL CONDUCTIVITY MEASUREMENTS

Thermal conductivity (TC) is measured in accordance with the following methods and is designated as $(BTU)(in)/(hr)(ft^2)(°F.)$:

Laser Flash

This is a transient technique in which the thermal diffusivity of a composite is determined by subjecting one face of the sample to a brief pulse of energy (less than 1 millisecond duration) from an infrared laser and monitoring the temperature rise on the opposite face with an infrared detector. Knowing the time/temperature profile of the back face of the sample and the distance between the two faces, the thermal diffusivity of the composite is calculated. Knowing this value and the density and specific heat of the composite, the thermal conductivity of the sample is calculated by taking the product of these three values.

Thick-Film Integrator

The film is placed on an aluminum surface which is held at a temperature of about 40° C. An aluminum cylinder, of known properties and equipped with a thermocouple, is held at room temperature (~25° C.) before being placed on top of the film sample. The temperature rise of the aluminum cylinder is monitored and subsequently analyzed to obtain the thermal resistance of the film and the film/aluminum interfaces. At least four layers of film are added sequentially to establish a relationship between thermal resistance and film thickness, from which the film thermal conductivity can be determined because compensation can then be made for the film/aluminum interface resistances. Pressure is applied to the "stacks" to minimize interface thermal resistances.

Guarded Heat Flow: Dynatech C-Matic Thermal Conductance Tester Model TCHM-DV (ASTM F433)

The sample is placed between two copper-surfaced plates controlled at different temperatures Surrounding the sample is a guard heater maintained at or near the mean sample temperature to minimize lateral heat transfer. The heat flux between the two plates is measured with a heat flux transducer attached to one of the plates. The overall temperature difference between the two plates surfaces is measured with built-in thermocouples. To reduce thermal resistance of the film/plate interfaces, a thin layer of a commercially available heat sink compound (such as Dow Corning 340) is usually applied to the sample and the test is run under external pressure. Knowing the sample thickness, the plate surface temperatures, the measured heat flux and the contact thermal resistance, the thermal conductivity of the sample can be determined.

Guarded Heat Flow: Thin Material

The Dynatech C-Matic tester is not particularly suited for very thin materials (i.e. with thicknesses less than 0.040"). Therefore, a guarded heat flow method and apparatus to measure through-the-thickness thermal conductivities of thin films has been developed.

The device consists of two copper rods, approximately 1" in diameter and 2" in length. Embedded along the length of each rod are two thermocouples, spaced 1" apart. The rods are wrapped in fiberglass insulation to prevent lateral heat loss. The film sample, coated with "Nujol" mineral oil, is placed between an end of each of the copper rods (which also have a coat of oil) to form a rod/film/rod stack. (The oil is present to ensure good heat transfer between the rods and the film). The stack is positioned between two heated press platens (top platen always hotter than the bottom platen), put under a compressive load to minimize interfacial thermal resistances, and wrapped with another layer of insulation. The stack is allowed to reach equilibrium and the resultant temperature profiles across the copper rods are recorded. The experiment is repeated with different platen set-point temperatures and stack pressures. By monitoring the resultant equilibrium temperature profiles across the copper rods and comparing them to a "standard" material under similar conditions, the thermal conductivity of the film can be calculated.

EXAMPLES

Example 1

87.5 grams of Ciba-Geigy hardener HT9679 and 12.5 grams of Ciba-Geigy hardener HT939 were added to a mixture of 60 grams of Dow Chemical "Quatrex" 1010 resin, 160 grams of Dow Chemical "Quatrex" 2010 and 180 grams of Union Carbide ERL-4206 resin. The resulting mixture was stirred until uniform. 40 grams of a three dimensional structure of mesophase pitch based carbon fiber were added to 60 grams of the resulting mixture to form a 40 weight % fiber reinforced epoxy resin. This filled mixture was passed through a 3 roll mill five times and cast onto a 5 mil thick silicone coated polyester film using a spatula. After curing at 160° C. for 1 hour, the filled adhesive film was removed from the polyester film and was polished using 500 and 1200 grit paper.

The polished film was tested for through-the-thickness thermal conductivity using the Guarded Heat Flow: Thin Material method. The thermal conductivity of this adhesive, listed in Table 1, is at least equivalent to those of 79 weight % silver flake filled Ditac ® QL ® Ribbon adhesives commercially available from Du Pont, yet the weight percent fibers was only 40%.

Example 2

27.5 parts of Union Carbide "UCAR" PKHJ phenoxy resin and 1.7 parts of Union Carbide "UCAR" BRL-2741 resole resin were dissolved in 53.2 parts of methyl ethyl ketone and 17.6 parts of toluene. 22.7 grams of this solution were mixed with 5 grams of a three dimensional structure of mesophase pitch based carbon fiber to yield a uniform dispersion. The filled adhesive resin solution was cast on 2 mil Mylar ® film using a 20 mil doctor knife and was dried in an oven at 120° C. for 5 minutes. The Mylar ® film was removed and a 4 mil thick, 45 weight % fiber reinforced adhesive film remained. Two 4 mil thick films were laminated together at 150° C. and 200 psi for 15 minutes to form a 6–8 mil thick adhesive film. An unfilled phenoxy/-phenol-formaldehyde sample and a 56 weight % fiber reinforced film were prepared in a similar manner.

The three samples were tested for through-the-thickness thermal conductivity using the Guarded Heat Flow: Thin Material method. Test results are given in Table 1 and indicate that the thermal conductivity of the filled adhesives are up to 2× those of 79 weight % silver flake filled Ditac ® QL ® Ribbon adhesives, yet at fiber loadings only 56% by weight or less.

TABLE 1

Thermal Conductivities of Adhesives

| Volume % Fibers | Weight % Fibers | Thermal Conductivity (BTU in/hr ft² °F.) |
|---|---|---|
| Unfilled Adhesive | 0 | 1.318 |
| 30 | 45 | 6.970 |
| 40 | 56 | 11.512 |
| 40 |  | 9.571 |

Example 3

A three dimensional structure of mesophase pitch based carbon fiber filled films containing 15, 29 and 39 weight % fibers (10, 20 and 28 volume percent fibers, respectively) were prepared as follows. Three separate dry blends of fibers and K copolyimide powder (representing the three fiber loadings) were prepared by placing the required weights of fiber and powder in polyethylene bags, tying the bags off, and then shaking and mixing the blends to make as uniform a mixture as possible. K copolyimide powder is based on pyromellitic dianhydride and a 70/30 (by weight) mixture of 1,3-bis(3-aminophenoxy)benzene and 2-phenyl-1, 4-bis(4-aminophenoxy))benzene. Approximately 600 grams of each blend were prepared.

Approximately 150–200 grams of a blend were spread out between two cover sheets of Kapton ® polyimide film on a belt and the "sandwich" was run through a continuous belt press with heated platens (345° C.). The cover sheets were removed and a fiber filled film remained. When one blend was completed and several pieces of film made, the procedure was repeated for the remaining two blends.

After this initial pass through the press (at a belt speed of 5 feet/minute), the pieces of film were run through the press two more times (with Kapton ® cover sheets which were then removed) but at a speed of 1 foot/minute to further reduce film thickness. The resulting films were approximately 3–4 feet long, 6–8 inches wide, 10–19 mils thick.

Unreinforced films were made similarly. The resulting films were approximately 45 feet long, 10 inches wide, 8–14 mils thick.

Pieces of the films were tested for in-plane tensile properties and coefficients of thermal expansions, as well as through-the-thickness thermal conductivities. Because thermal conductivity measurements are made using a variety of techniques and methods, the thermal conductivities were measured via four different methods described herein for comparisons and data validations.

Table 2 gives the results which indicate that the film properties are a function of fiber loading; as fiber loadings increase, both out-of-plane thermal conductivities and tensile moduli increase while in-plane CTE's decrease. The highest loaded film has a uniform CTE (10 ppm/°C.) near that of alumina (6–8 ppm/°C.), a typical "target CTE" electronic packaging material. Compared to Ditac ® QL ® Ribbon adhesive data, the thermal conductivity and modulus of the highest loaded film are at least equivalent and the CTE is 4× lower than these silver filled adhesives, yet the fiber loading was only 39% by weight.

Example 4

Two identical 2"×2" squares were cut from a circuit board constructed of six layers of Du Pont Pyralux ® flexible composites bonded together with Pyralux ® LG1002 glass reinforced modified acrylic adhesive. Each layer of flexible composite was constructed with a LF9111 copper-clad laminate coverlayed on both sides with LF0210 coverlay.

Two identical 2"×2" squares were cut from a pitch fiber reinforced metal matrix composite heat sink constructed of 16 layers of 6063 aluminum reinforced with E-120 continuous pitch fibers. The fiber orientation was [0/90]$_{4S}$ and the fiber volume fraction was 35%. One surface of each metal matrix square was scraped with a razor blade and cleaned with solvent to remove all surface contaminants.

One circuit board square was bonded to a heat sink square using Hysol Aerospace & Industrial Products Division Epoxi-patch clear 0151 two part epoxy adhesive by brushing a well stirred mix on the clean metal surface, placing the circuit board on the adhesive, and curing the laminated sample under minimum (<25 psi) pressure. The other squares were bonded to each other with the same base adhesive but the adhesive had been filled with 25 weight percent of a three-dimensional structure of mesophase pitch based carbon fiber blended in as the two part epoxy was mixed.

Both samples were tested for through-the-thickness system thermal conductivities using the Guarded Heat Flow: Dynatech C-Matic Thermal Conductance Tester method. The system thermal conductivity of the sample having the filled adhesive was 3.398 (BTU)-(in)/(hr)(ft²)(°F.) vs. 2.705 (BTU)(in)/(hr)(ft²)(°F.) for the sample having the unfilled adhesive, a 26% improvement.

TABLE 2

| Volume % Fibers | Weight % Fibers | Density # (g/cc) | CTE (MD) (ppm/°C.) | CTE (TD) (ppm/°C.) | Thermal Conductivity* (Btu in/hr ft² °F.) | Thermal Conductivity** (Btu in/hr ft² °F.) | Thermal Conductivity (Btu in/hr ft² °F.) | Thermal Conductivity (Btu in/hr ft² °F.) | Tensile ## Modulus (MD) (Kpsi) | Tensile ## Modulus (TD) (Kpsi) |
| --- | --- | --- | --- | --- | --- | --- | --- | --- | --- | --- |
| Unfilled Film | 0 | 1.31 | 46 | 44 | 1.248 | 1.179 | 1.179 | 0.902 | 494 | 487 |
| 10 | 15 | 1.43 | 22 | 36 | 1.387 | | 2.497 | 2.705 | 756 | 687 |
| 20 | 29 | 1.49 | 20 | 19 | 3.260 | | 4.022 | 3.745 | 1293 | 1045 |
| 28 | 39 | 1.56 | 10 | 10 | 3.329 | 5.791 | 9.016 | | 1212 | 1117 |

NOTES:
Fiber volumes are ±3%.
CTE values were determined with a Perkin Elmer TMA using an "extension" probe and a 5 gram force. They are representative of the temperature range 25-175° C.
MD = Machine Direction and TD = Tranverse Direction (both in-plane)
ASTM D792
ASTM D638
*ASTM F433 (Dynatech C-Matic Guarded Heat Flow method), 50°C., through-the-thickness measurement.
**Guarded Heat Flow:Thin Material method, 90° C., through-the-thickness measurement.
 Laser Flash method, 25° C., through-the-thickness measurement (by University of Delaware).
  Thick-Film Integrator method, 25° C., through-the-thickness measurement (by University of Delaware).

What is claimed is:

1. A thermally conductive adhesive material comprising an adhesive resin filled with from about 20 to about 60 weight percent of a three-dimensional structure of pitch based carbon fibers.

2. The thermally conductive adhesive material of claim 1 wherein said material is in the form of a film.

3. The thermally conductive adhesive material of claim 1 wherein said material is in the form of a film.

4. The adhesive material of claim 1 wherein said adhesive resin is selected from the group consisting of thermoplastic, thermosetting, elastomeric or combinations thereof.

5. The adhesive material of claim 1, said material having a thermal conductivity in the range of from about 6 to about 12 (BTU)(in)/(hr)(ft²)(°F.).

6. The adhesive material of claim 1 wherein said adhesive resin is a thermosetting resin.

7. The adhesive material of claim 6 wherein said pitch based carbon fibers are mesophase pitch.

8. An electronic system having component parts bonded by a layer of adhesive resin filled with from about 20 to about 60 weight % of a three-dimensional structure of pitch based carbon fibers.

9. The system of claim 8 wherein said adhesive material is selected form the group consisting of thermoplastic, thermosetting, elastomeric and combinations thereof.

10. The system of claim 9 wherein said adhesive resin is a thermosetting resin.

* * * * *

UNITED STATES PATENT AND TRADEMARK OFFICE
CERTIFICATE OF CORRECTION

PATENT NO. : 5,026,748

DATED : June 25, 1991

INVENTOR(S) : Jerome Thomas Adams and Bruce Allen Yost

It is certified that error appears in the above—identified patent and that said Letters Patent is hereby corrected as shown below:

Col. 7, line 30, change "film" to --paste--.

Signed and Sealed this

Second Day of February, 1993

Attest:

STEPHEN G. KUNIN

Attesting Officer

Acting Commissioner of Patents and Trademarks